(12) United States Patent
Sato et al.

(10) Patent No.: US 10,829,042 B2
(45) Date of Patent: Nov. 10, 2020

(54) IMAGING APPARATUS WITH IMAGE SENSOR FOR DETECTING LIGHT IN AN ATMOSPHERIC PEAK AND VEHICLE HAVING SAME

(71) Applicant: KYOCERA Corporation, Kyoto (JP)

(72) Inventors: Hiroyuki Sato, Yokohama (JP); Hidetoshi Umeda, Esslinger (DE); Takatoshi Nakata, Yokohama (JP); Shinsuke Tachibana, Yokohama (JP); Yasushi Koshiba, Yokohama (JP); Shota Iwano, Sagamihara (JP)

(73) Assignee: KYOCERA Corporation, Kyoto (JP)

( * ) Notice: Subject to any disclaimer, the term of this patent is extended or adjusted under 35 U.S.C. 154(b) by 113 days.

(21) Appl. No.: 15/531,335

(22) PCT Filed: Nov. 27, 2015

(86) PCT No.: PCT/JP2015/005910
§ 371 (c)(1),
(2) Date: May 26, 2017

(87) PCT Pub. No.: WO2016/084385
PCT Pub. Date: Jun. 2, 2016

(65) Prior Publication Data
US 2017/0320434 A1 Nov. 9, 2017

(30) Foreign Application Priority Data
Nov. 27, 2014 (JP) .................................. 2014-240356

(51) Int. Cl.
*B60R 1/00* (2006.01)
*H04N 9/07* (2006.01)
(Continued)

(52) U.S. Cl.
CPC .................. *B60R 1/00* (2013.01); *G02B 5/20* (2013.01); *G06K 9/00805* (2013.01);
(Continued)

(58) Field of Classification Search
CPC ...... H04N 5/332; H04N 5/335; H04N 5/2354; G01S 7/4876
See application file for complete search history.

(56) References Cited

U.S. PATENT DOCUMENTS

2003/0085710 A1* 5/2003 Bourgault .............. H05B 45/48
324/414
2006/0092401 A1* 5/2006 Troxell ............. B60R 21/01552
356/4.01

(Continued)

FOREIGN PATENT DOCUMENTS

JP 2005-159918 A 6/2005
JP 2008-244246 A 10/2008
(Continued)

OTHER PUBLICATIONS

International Search Report issued in PCT/JP2015/005910; dated Jan. 12, 2016.
(Continued)

*Primary Examiner* — Francis Geroleo
*Assistant Examiner* — Christopher Kingsbury Glover
(74) *Attorney, Agent, or Firm* — Studebaker & Brackett PC

(57) ABSTRACT

An imaging apparatus includes an image sensor and an image processor. The image sensor has at least one type of color filter and a specific filter disposed thereon in a manner corresponding to each pixel on a light receiving surface. The specific filter transmits light in a particular wavelength range
(Continued)

in which spectral irradiance of sunlight is lower than that in wavelength ranges adjacent to either side of the particular wavelength range. The image processor detects an emission state of a particular light source based on a signal component of an image signal generated by pixels having the specific filters thereon. The particular light source is different from the sunlight.

5 Claims, 11 Drawing Sheets

(51) Int. Cl.
 *G02B 5/20* (2006.01)
 *H04N 7/18* (2006.01)
 *H04N 9/04* (2006.01)
 *G06K 9/00* (2006.01)
 *G06K 9/46* (2006.01)
 *H01L 27/146* (2006.01)

(52) U.S. Cl.
 CPC ...... *G06K 9/4661* (2013.01); *H01L 27/14621* (2013.01); *H01L 27/14645* (2013.01); *H04N 7/18* (2013.01); *H04N 9/045* (2013.01); *H04N 9/07* (2013.01); *B60R 2300/10* (2013.01); *B60R 2300/8093* (2013.01)

(56) References Cited

U.S. PATENT DOCUMENTS

| | | | |
|---|---|---|---|
| 2008/0232710 A1* | 9/2008 | Rai | G06T 5/50 382/275 |
| 2011/0211056 A1* | 9/2011 | Publicover | H04N 7/18 348/78 |
| 2011/0235017 A1* | 9/2011 | Iwasaki | H04N 5/332 356/4.01 |

FOREIGN PATENT DOCUMENTS

| | | |
|---|---|---|
| JP | 2011-199798 A | 10/2011 |
| JP | 2014-157184 A | 8/2014 |

OTHER PUBLICATIONS

Written Opinion issued in PCT/JP2015/005910; dated Jan. 12, 2016; with English language Concise Explanation.

* cited by examiner

FIG. 4

IMAGING APPARATUS WITH IMAGE SENSOR FOR DETECTING LIGHT IN AN ATMOSPHERIC PEAK AND VEHICLE HAVING SAME

CROSS REFERENCE TO RELATED APPLICATION

This application claims priority to and the benefit of Japanese Patent Application No. 2014-240356 filed on Nov. 27, 2014, the entire contents of which are incorporated herein by reference.

TECHNICAL FIELD

The disclosure relates to an imaging apparatus and a vehicle.

BACKGROUND

There is proposed an imaging apparatus in which, to obtain functions other than capturing a color image, a filter for a particular wavelength range is arranged in a portion of a color filter array.

SUMMARY

An imaging apparatus according to one embodiment includes:

an image sensor having, in a manner corresponding to each pixel on a light receiving surface, at least one type of color filter and a specific filter configured to transmit light in a particular wavelength range in which spectral irradiance of sunlight is lower than that in wavelength ranges adjacent to either side of the particular wavelength range; and an image processor configured to detect, based on a signal component generated by pixels having the specific filters thereon in an image signal obtained from the image sensor, an emission state of a particular light source different from the sunlight emitted to an imaging range of the image sensor.

Also, an imaging apparatus according to one embodiment includes: an image sensor having, in a manner corresponding to each pixel on a light receiving surface, at least one type of color filter and a specific filter configured to transmit light in a particular wavelength range in which spectral irradiance of sunlight is lower than that in wavelength ranges adjacent to either side of the particular wavelength range; and an image processor configured to determine whether brightness of a first captured image generated by at least pixels of the image sensor having the color filters thereon is lower than a predetermined criteria, and obtain, when determining that the brightness of the first captured image is equal to or higher than the predetermined criteria, a second captured image generated by pixels having the specific filters alone.

Further, a vehicle according to one embodiment includes:

an imaging apparatus including an image sensor having, in a manner corresponding to each pixel on a light receiving surface, at least one type of color filter and a specific filter configured to transmit light in a particular wavelength range in which spectral irradiance of sunlight is lower than that in wavelength ranges adjacent to either side of the particular wavelength range and also including an image processor configured to detect, based on a signal component of pixels having the specific filters thereon in an image signal obtained from the image sensor, an emission state of a particular light source different from the sunlight emitting light to an imaging range of the image sensor; and the particular light source.

BRIEF DESCRIPTION OF THE DRAWINGS

In the accompanying drawings:

FIG. 4 is a diagram illustrating an arrangement in a filter array of color filters for covering a light receiving surface of an image sensor of FIG. 3;

DETAILED DESCRIPTION

For example, it is proposed to arrange a filter for a wavelength range suitable for capturing the iris on the image sensor and, when capturing an image of the iris, to capture the image using pixels having the filter thereon alone.

Recently, the imaging apparatus has been used for a variety of application and required to exhibit a specific function according to the application. However, a conventional camera is not always capable of exhibiting the specific function according to the application.

Therefore, it could be helpful to provide an imaging apparatus and a vehicle capable of exhibiting the specific function according to the application.

The imaging apparatus and the vehicle of the disclosure can exhibit a specific function according to application.

Hereinafter, embodiments of an imaging apparatus of the disclosure will be described with reference to the accompanying drawings.

First Embodiment

Figure 1:
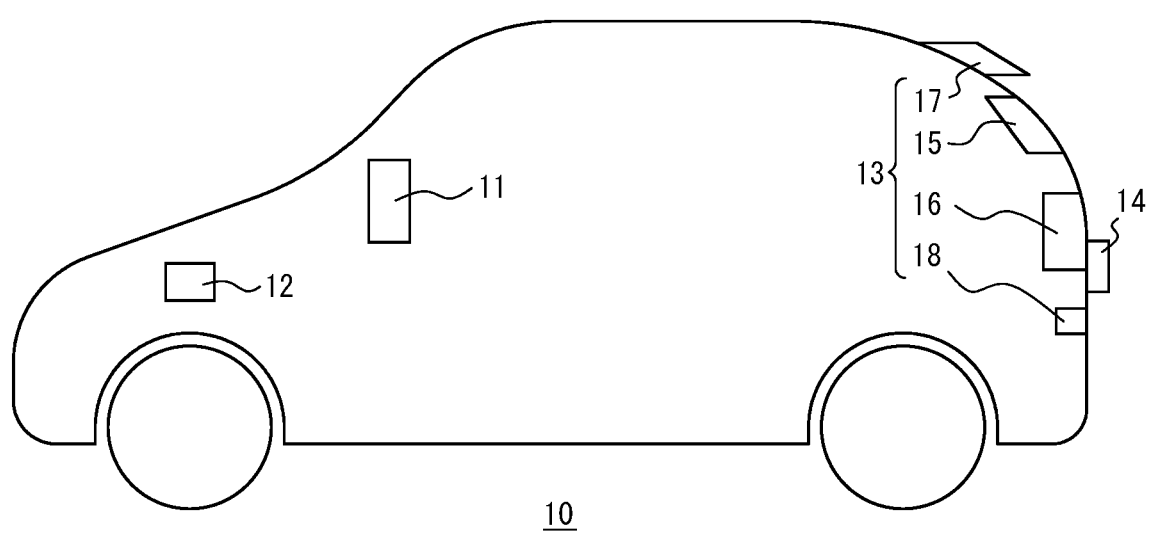
FIG. 1 is a diagram illustrating an arrangement of various units in a car having an imaging apparatus of a first embodiment.

FIG. 1 is a schematic side view illustrating an arrangement of an imaging apparatus according to one embodiment in a car (a vehicle). A car 10 includes a display unit 11, a lamp ECU 12, a particular light source 13, and an imaging apparatus 14. The imaging apparatus 14, the display unit 11, and the lamp ECU 12 may exchange information and signals one another via a car network such as a dedicated line and CAN. Similarly, the lamp ECU 12 and the particular light source 13 may exchange information and signals one another via the car network such as the dedicated line and the CAN.

The display unit 11 is disposed in a position visible from a driver. The lamp ECU 12 is disposed in any position in the car 10. The particular light source 13 includes, for example, a tail lamp 15, a brake lamp 16, a backup lamp 17, and an indicator lamp 18 and is disposed in a rear portion of the car 10. Each imaging apparatus 14 is disposed in the rear portion of the car 10 in such a manner as to be able to capture an image of a subject outside the car 10, e.g., the subject behind the car 10.

The display unit 11 is, for example, a liquid crystal display and displays a variety of images. In the present embodiment, the display unit 11 displays an image corresponding to an image signal obtained from the imaging apparatus 14.

The lamp ECU 12, in response to an input operation performed by the driver, drives various types of lamps of the car 10. In the present embodiment, for example, in response to an input operation to turn on a lamp switch performed by the driver, the lamp ECU 12 lights up the tail lamp 15. In the present embodiment, also, in response to an input operation to step on a brake pedal performed by the driver, the lamp ECU 12 lights up the brake lamp 16. In the present embodiment, also, in response to an input operation to move a shift lever to a reverse position performed by the driver, the lamp ECU 12 lights up the backup lamp 17. In the present embodiment, further, in response to an input operation to flick a signal lever into either direction performed by the driver, the lamp ECU 12 lights up the indicator lamp 18. Also, when the tail lamp 15, the brake lamp 16, the backup lamp 17, or the indicator lamp 18 is lit up, the lamp ECU 12 transmits information about such a state to the imaging apparatus 14. Further, based on information about a following car obtained from the imaging apparatus 14 as described later, the lamp ECU 12 adjusts a quantity of light and an emitting direction of the tail lamp 15.

Figure 2:
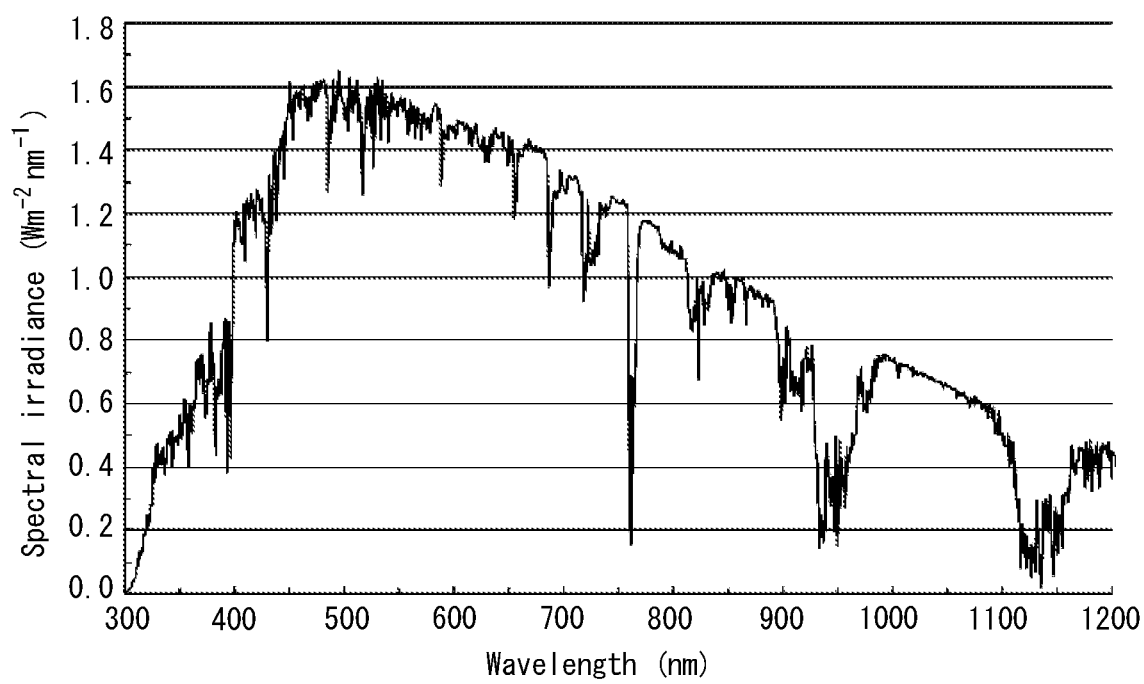
FIG. 2 is a graph of spectral irradiance of the sunlight.

The tail lamp 15, the brake lamp 16, the backup lamp 17, and the indicator lamp 18 are lit up or turned off based on control of the lamp ECU 12. The tail lamp 15, the brake lamp 16, the backup lamp 17, and the indicator lamp 18 respectively have, for example, incandescent bulbs serving as light source and emit, in a radiation spectrum of the sunlight, light at least in a particular wavelength range in which spectral irradiance is lower than that in wavelength ranges adjacent to either side of the particular wavelength range. The particular wavelength range is, as illustrated in FIG. 2, for example, a wavelength range of 320 nm or less to be absorbed by $O_3$, a wavelength range of 750 nm to 760 nm to be absorbed by $H_2O$ or $O_2$, a wavelength range of 930 nm to 970 nm, or a wavelength range of 1100 nm to 1170 nm.

The imaging apparatus 14 captures an image of the subject. Also, the imaging apparatus 14, based on the image of the subject, detects an emission state of the particular light source 13. Further, the imaging apparatus 14 performs predetermined image processing on the image of the subject and outputs thus processed image to the display unit 11. The following is a detailed description of a function of the imaging apparatus 14 described above, together with a configuration of the imaging apparatus 14.

Figure 3:
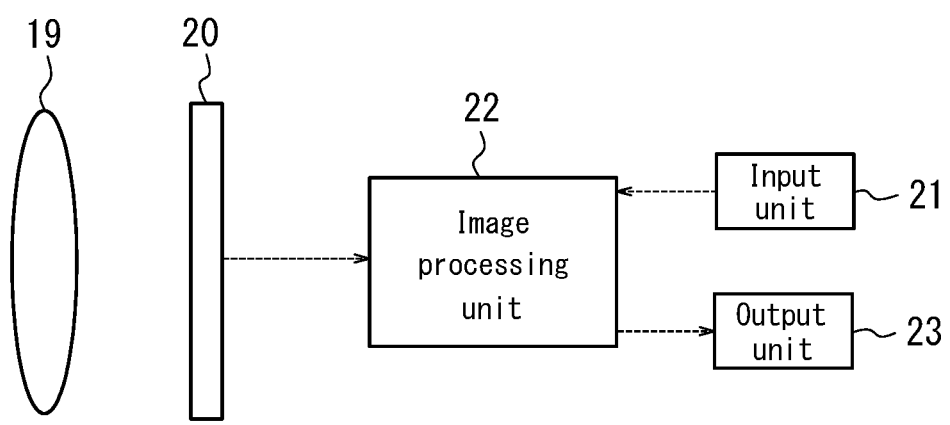
FIG. 3 is a functional block diagram illustrating a schematic configuration of the imaging apparatus of FIG. 1.

As illustrated in FIG. 3, the imaging apparatus 14 includes an optical system 19, an image sensor 20, an input unit 21, an image processing unit 22, and an output unit 23.

The optical system 19 is configured with an optical element having at least one lens in such a manner as to have desired optical properties such as a focal distance, a focal depth, and an angle of view. The optical system 19 forms a subject image in the image sensor 20.

The image sensor 20 is, for example, a CMOS image sensor or a CCD image sensor and generates an image signal by capturing the subject image formed in a light receiving surface. In the light receiving surface of the image sensor 20, a plurality of pixels are two-dimensionally arranged, each of which generates a pixel signal corresponding to intensity of received light. The image signal of one frame is composed of pixel signals generated by the pixels constituting the light receiving surface.

Figure 4:
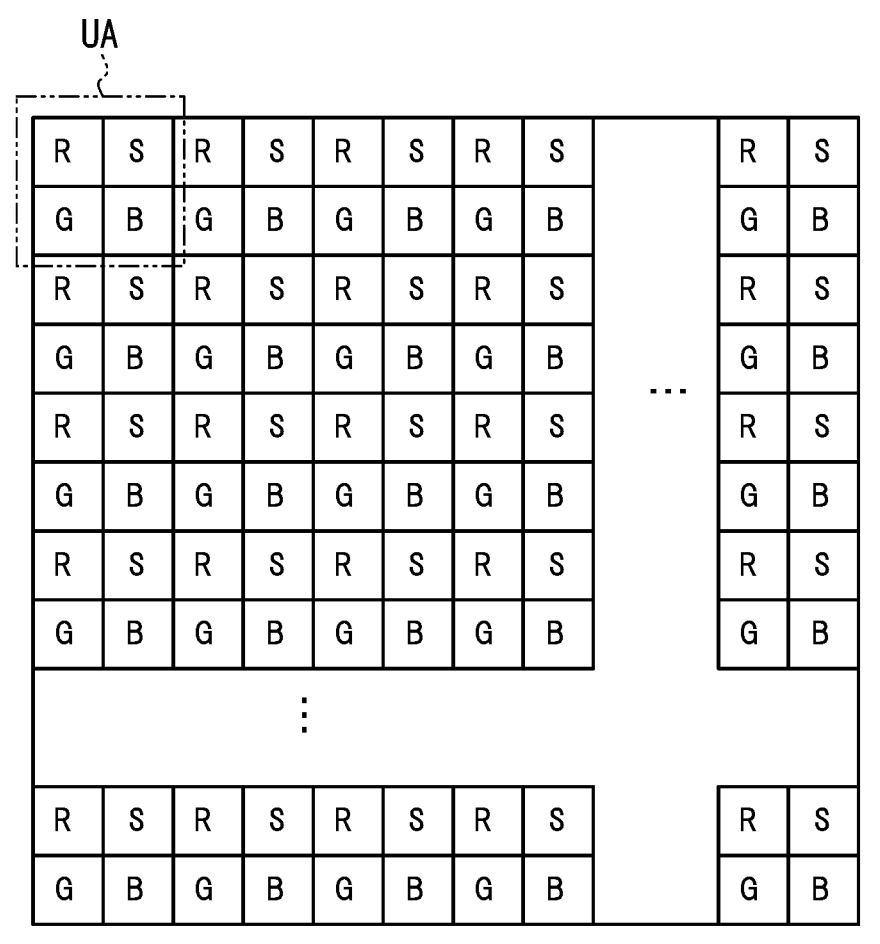

Each of the pixels is covered with either one of at least one color filter and a specific filter. In the present embodiment, the at least one color filter is, for example, an R filter, a G filter, or a B filter. The at least one color filter may be a filter of another visible light range. The specific filter has a transmittable range for a particular wavelength range described above contained in the light emitted by the particular light source 13 described above. As illustrated in FIG. 4, unit arrays UA composed of one each of the R filter (see a reference sign "R"), the G filter (see a reference sign "G"), the B filter (see a reference sign "B"), and a specific filter (see a reference sign "S") are cyclically two-dimensionally arranged. However, an arrangement of the filters is not limited to this manner. For example, the unit arrays UA including the specific filter may be arranged in such a manner as to be replaced in a portion in row and column directions of Bayer pattern.

The input unit 21 obtains, from the lamp ECU 12, information that the tail lamp 15, the brake lamp 16, the backup lamp 17, or the indicator lamp 18 is light up.

The image processing unit 22 is DSP or a general-purpose CPU for performing a specific function by reading a specific program. The image processing unit 22 obtains the image signal from the image sensor 20. The image processing unit 22 performs pre-processing such as white balancing and color interpolation on the image signal. The image processing unit 22 also performs post-processing such as edge enhancement on the image signal subjected to the pre-processing. Also, the image processing unit 22, as described later, detects the emission state of the particular light source 13 emitting light to an imaging range of the image signal, i.e., an imaging range of the image sensor. Further, the image processing unit 22, as described later, performs particular image processing, as a part of the post-processing, on the image signal subjected to the pre-processing.

The output unit 23 outputs, to the display unit 11, the image signal subjected to the predetermined image processing including the pre-processing and the post-processing performed by the image processing unit 22. The output unit 23 also outputs, to at least one of the display unit 11 and the lamp ECU 12, information generated by the image processing unit 22 based on detection of the emission state of the particular light source 13.

Next, the detection of the emission state of the particular light source 13 and the particular image processing which are performed by the image processing unit 22 in the present embodiment will be described in detail. The detection of the emission state of the particular light source 13 includes detection of an actual emission state of the particular light source 13, i.e., detection of abnormality of the particular light source 13, and determination on whether light is emitted to a following object. The following separately describes about the detection and the determination.

The image processing unit 22 performs the detection of abnormality of the particular light source 13 when receiving, from the lamp ECU 12, the information that the particular light source 13 is lit up.

The image processing unit 22, first, from the image signal obtained from the image sensor 20, extracts signal components corresponding to a quantity of light in the particular wavelength range, e.g., signal components generated by the pixels having the specific filters thereon. The pixels whose signal components are extracted may be either all pixels constituting the image or pixels within a range to which the light is assumed to be emitted from the particular light source 13.

The image processing unit 22 determines that the particular light source 13 is normal when signal strength of the signal component extracted, i.e., the actual quantity of light emitted by the particular light source 13 is sufficient, while determining that the particular light source 13 is abnormal when the signal strength is low. In particular, the image processing unit 22 determines whether the particular light source 13 is abnormal by comparing between the signal components of the pixel having the specific filter thereon with the particular light source 13 lit up and the signal components of the pixel having the specific filter thereon with the particular light source 13 turned off, e.g., by comparing a ratio of these signal components to a threshold. Or, the image processing unit 22 may compare, for example, a mean value of the signal strength of the signal components extracted with a threshold and determine that the particular light source 13 is normal when the mean value exceeds a threshold, or determine that the particular light source 13 is abnormal when the mean value is equal to or smaller than the threshold.

The image processing unit 22, when determining that the particular light source 13 is abnormal, generates a notification image for notifying that the particular light source 13 is abnormal, such as an image in which a message is superimposed on an image obtained from the image sensor 20. The image processing unit 22 outputs the notification image to the display unit 11 via the output unit 23 such that the display unit 11 displays the notification image.

The image processing unit 22, when receiving, from the lamp ECU 12, the information that the particular light source 13, e.g., the tail lamp 15 is lit up, determines whether the light is emitted to a following object such as a car. First, in a manner similar to the determination whether the particular light source 13 is abnormal, the image processing unit 22, from the image signal obtained from the image sensor 20, extracts the signal components corresponding to the quantity of light in the particular wavelength range, e.g., the signal components generated by the pixels having the specific filter thereon.

The image processing unit 22 extracts, from the signal components extracted, a signal component with the signal strength exceeding the threshold and calculates position coordinates of a pixel corresponding in the entire image. The image processing unit 22 performs a known object recognition operation to the entire image and detects another car. The image processing unit 22 determines whether a region occupied by a car detected overlaps the position coordinates calculated.

When position coordinates of the car detected overlaps the position coordinates calculated, i.e., a position with a large quantity of light in the particular wavelength range, the image processing unit 22 generates a command to lower the emitting direction of the light from the tail lamp 15 into a vertically downward direction, or a command to reduce the quantity of light. The image processing unit 22 outputs one of the commands to the lamp ECU 12 via the output unit 23 such that at least one of the emitting direction of the light and the quantity of light from the tail lamp 15 is adjusted.

The image processing unit 22 performs the predetermined image processing when receiving, from the lamp ECU 12, the information that the particular light source 13, e.g., the backup lamp 17 is lit up. First, the image processing unit 22 extracts a pixel having luminance based on signal components of a wavelength range other than the particular wavelength range, e.g., RBG signal components exceeding the threshold. Next, the image processing unit 22 determines whether the pixels extracted form a region larger than a predetermined size (predetermined number of pixels).

Further, the image processing unit 22, from the pixel forming the region larger than the predetermined size, generates a monochrome image by using the signal components of the particular wavelength range, i.e., the signal components generated by the pixel having the specific filter thereon, without using the signal components of the RGB. Further, the image processing unit 22, from other pixels, generates a color image in a normal manner and generates, as the image signal, an image formed by combining the color image and the monochrome image. The image processing unit 22 outputs the image signal to the display unit 11 via the output unit 23 such that the display unit 11 displays the image.

Figure 5:
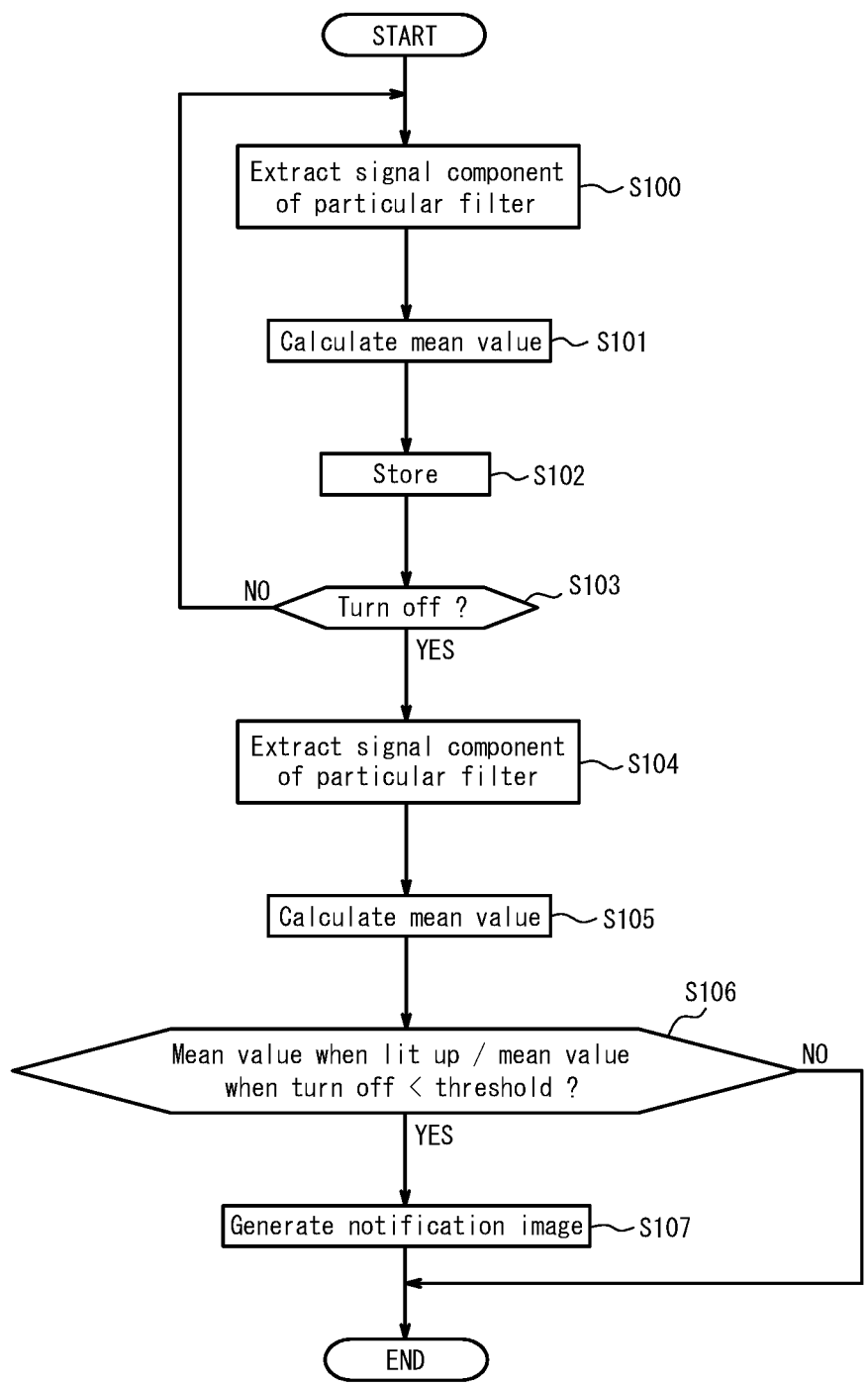
FIG. 5 is a flowchart illustrating an abnormality detection process of a particular light source performed by an image processing unit of FIG. 3.

Next, an abnormality detection process of the particular light source 13 performed by the image processing unit 22 according to the present embodiment will be described with reference to FIG. 5. The image processing unit 22 starts the abnormality detection process of the particular light source 13 upon receiving, from the lamp ECU 12, the information that the particular light source 13 is lit up.

At step S100, the image processing unit 22 extracts, from the image signal, the signal components corresponding to the quantity of light in the particular wavelength range. After the extraction of the signal components, the abnormality detection process proceeds to step S101.

At step S101, the image processing unit 22 calculates the mean value of the signal strength of the signal components extracted at step S100. When the image processing unit 22 has already calculated the mean value of the signal strength of image signals of a previous frame, the image processing unit 22 calculates a mean value of a total of the mean value of the signal strength of the signal components extracted at step S100 and the mean value of the signal strength of the image signals of the previous frame. After calculating the mean value of the signal strength, the abnormality detection process proceeds to step S102.

At step S102, the image processing unit 22 stores, in a memory thereof, the mean value of the signal strength calculated at step S102. After the mean value is stored in the memory, the abnormality detection process proceeds to step S103.

At step S103, the image processing unit 22 determines whether information to turn off the particular light source 13 has been received from the lamp ECU 12. When the information to turn off the particular light source 13 has not been received, the abnormality detection process returns to step S100. When the information to turn off the particular light source 13 has been received, the abnormality detection process proceeds to step S104.

At step S104, the image processing unit 22 extracts, from the image signal, the signal components corresponding to the quantity of light in the particular wavelength range. After the extraction of the signal components, the abnormality detection process proceeds to step S105.

At step S105, the image processing unit 22 calculates the mean value of the signal strength of the signal components extracted at step S104. After the calculation of the mean value of the signal strength, the abnormality detection process proceeds to step S106.

At step S106, the image processing unit 22 compares, to the threshold, a ratio of the mean value of the signal strength with the particular light source 13 lit up stored in the memory at step S102 to the mean value of the signal strength with the particular light source 13 turned off calculated at step S105. When the ratio is equal to or greater than the threshold, the abnormality detection process of the particular light source 13 ends skipping step S107. When the ratio is smaller than the threshold, the abnormality detection process proceeds to step S107.

At step S107, the image processing unit 22 generates the notification image for notifying that the particular light source 13 is abnormal. Also, the image processing unit 22 outputs the notification image to the display unit 11 via the output unit 23. After the output of the notification image, the abnormality detection process of the particular light source 13 ends.

Figure 6:
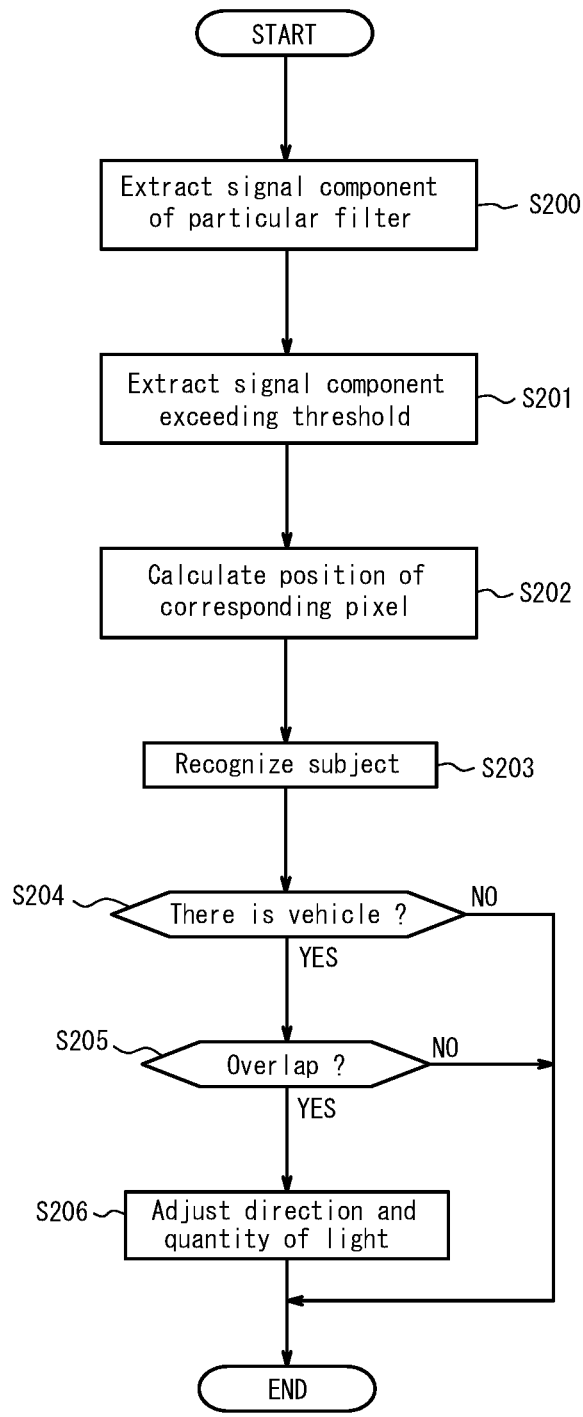
FIG. 6 is a flowchart illustrating a process to determine whether light is emitted to a following object performed by the image processing unit of FIG. 3.

Next, a determination process for determining whether the light is emitted to the following object performed by the image processing unit 22 in the present embodiment will be described with reference to FIG. 6. Upon receiving the information that the particular light source 13 is lit up from the lamp ECU 12, the image processing unit 22 starts the determination process for determining whether the light is emitted to the following object.

At step S200, the image processing unit 22 extracts, from the image signal, the signal components corresponding to the quantity of light in the particular wavelength range. After the extraction of the signal components, the determination process proceeds to step S201.

At step S201, the image processing unit 22, from the signal components extracted at step S200, further extracts signal components exceeding the threshold. After the extraction of such signal components, the determination process proceeds to step S202.

At step S202, the image processing unit 22 calculates the position coordinates of the pixels corresponding to the signal components extracted at step S201. After the calculation of the position coordinates, the determination process proceeds to step S203.

At step S203, the image processing unit 22 performs object recognition in the entire image. After the object recognition, the determination process proceeds to step S204.

At step S204, the image processing unit 22 determines whether the image contains a car based on the object recognition performed at step S203, When the image contains a car, the determination process proceeds to step S205. When the image does not contain a car, the determination process for determining whether the light is emitted to the following object ends.

At step S205, the image processing unit 22 determines whether the region occupied by the car and the position coordinates of the pixels calculated at step S202 overlap with each other. When the region and the position coordinates overlap with each other, the determination process proceeds to step S206. When the region and the position coordinates do not overlap with each other, the determination process for determining whether the light is emitted to the following object ends.

At step S206, the image processing unit 22 generates the command to lower the emitting direction of the light from the tail lamp 15 in the vertically downward direction or the command to reduce the quantity of light from the tail lamp 15. Also, the image processing unit 22 outputs one of the commands to the lamp ECU 12 via the output unit 23. After the output of one of the commands, the determination process for determining whether the light is emitted to the following object ends.

Figure 7:
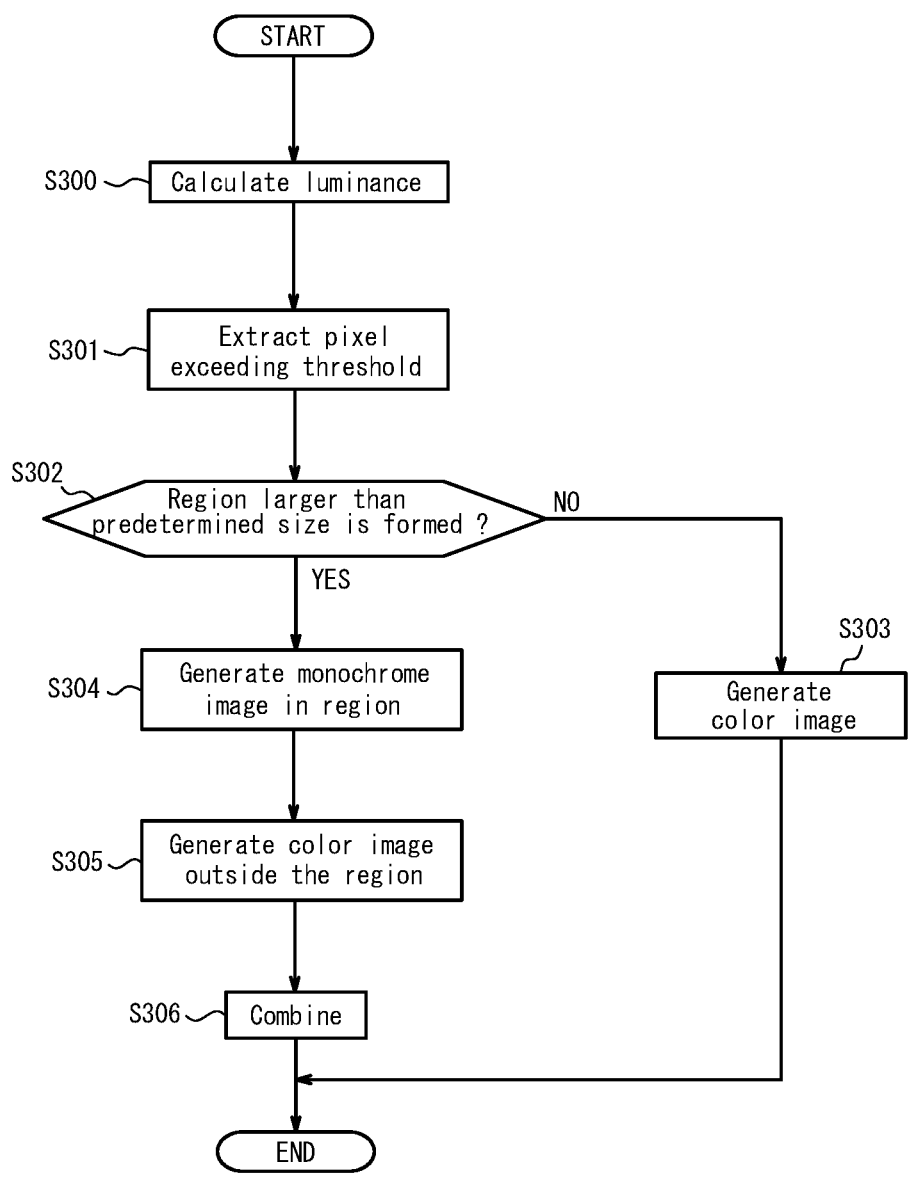
FIG. 7 is a flowchart illustrating particular image processing performed by the image processing unit of FIG. 3.

Next, the particular image processing performed by the image processing unit 22 in the present embodiment will be described with reference to FIG. 7. The image processing unit 22 starts the particular image processing upon receiving, from the lamp ECU 12, the information that the particular light source 13 is lit up.

At step S300, the image processing unit 22 calculates luminance of each pixel by using RGB signal components. After the calculation of the luminance of all pixels, the particular image processing proceeds to step S301.

At step S301, the image processing unit 22 extracts, from the image signal, pixels with luminance exceeding the threshold. After the extraction of such pixels, the particular image processing proceeds to step S302.

At step S302, the image processing unit 22 determines whether the pixels extracted at step S301 form a region larger than the predetermined size. When the pixels do not form a region larger than the predetermined size, the particular image processing proceeds to step S303. When the pixels form a region larger than the predetermined size, the particular image processing proceeds to step S304.

At step S303, the image processing unit 22 generates the color image by using the RGB signal components alone with respect to the entire region of the image signal. The image processing unit 22, also, performs the post-processing on the color image generated and outputs the color image subjected to the post-processing to the display unit 11. After the output of the color image, the particular image processing ends.

At step S304, the image processing unit 22 generates the monochrome image by using the signal components of the particular wavelength range alone in the region determined at step S302. After the generation of the monochrome image, the particular image processing proceeds to step S305.

At step S305, the image processing unit 22 generates the color image by using the RGB signal components alone in a region of the image signal outside the region determined at step S302. After the generation of the color image, the particular image processing proceeds to step S306.

At step S306, the image processing unit 22 generates a combined image by combining the monochrome image generated at step S304 and the color image generated at step S305. The image processing unit 22 performs the post-processing on the combined image and outputs the combined image subjected to the post-processing to the display unit 11. After the output of the combined image, the particular image processing ends.

The imaging apparatus 14 of the first embodiment configured as described above detects the emission state of the particular light source 13 based on the signal component of the pixel having the specific filter thereon. Therefore, in an outdoor place where it is very bright with the sunlight, the emission state of the particular light source 13, which the naked eye has difficulty in seeing, may be detected. Therefore, the imaging apparatus 14 may exert a specific function to detect, according to application thereof to capture an image of a subject such as the car 10 which has been illuminated by the light from the particular light source 13, the emission state of the particular light source 13 when the subject is more brightly illuminated by the sunlight.

According to the imaging apparatus of the present embodiment, also, since the imaging apparatus 14 includes the input unit 21, a starting condition may be provided for the processes that use the pixel having the specific filter thereon (i.e., the abnormality detection process of the particular light source 13, the determination on whether the light is emitted to a following object, and the particular image processing). Providing the starting condition enables prevention of unnecessary execution of the process that use the pixel having the specific filter thereon. As a result, power consumption may be reduced.

According to the imaging apparatus of the present embodiment, also, when the particular light source 13 is emitting the light, the actual emission state of the particular light source 13, in other words, whether the particular light source 13 is abnormal may be detected based on the signal components of the pixels having the particular filters thereon. Therefore, even in a bright condition such as during daytime, the abnormality of the particular light source 13, which the human eyes have difficulty in seeing in the color image, may be detected by using a specific image.

The imaging apparatus of the present embodiment, also, when the particular light source 13 is emitting the light, determines whether a following car is illuminated by the light. When determining that the following car is illuminated by the light, the imaging apparatus of the present embodiment adjusts the emitting direction and the like of the light. Therefore, the light from the particular light source 13 which would otherwise dazzle eyes of a person in the following car may become less glaring.

According to the imaging apparatus of the present embodiment, further, when the signal components generated by the pixels other than the pixel having the specific filter thereon exceed the threshold, the signal component generated by the pixel having the specific filter thereon is used to generate the image. Therefore, for example, when capturing an image of a subject outside a tunnel, overexposure of the subject otherwise occurs due to exposure adjustment for a dark place and the like may be prevented, since the brightness of the sunlight is suppressed while the particular light source 13 appropriately emits the light in the particular wavelength range. As a result, the subject outside the tunnel may be reproduced in a visible manner.

Second Embodiment

Figure 8:
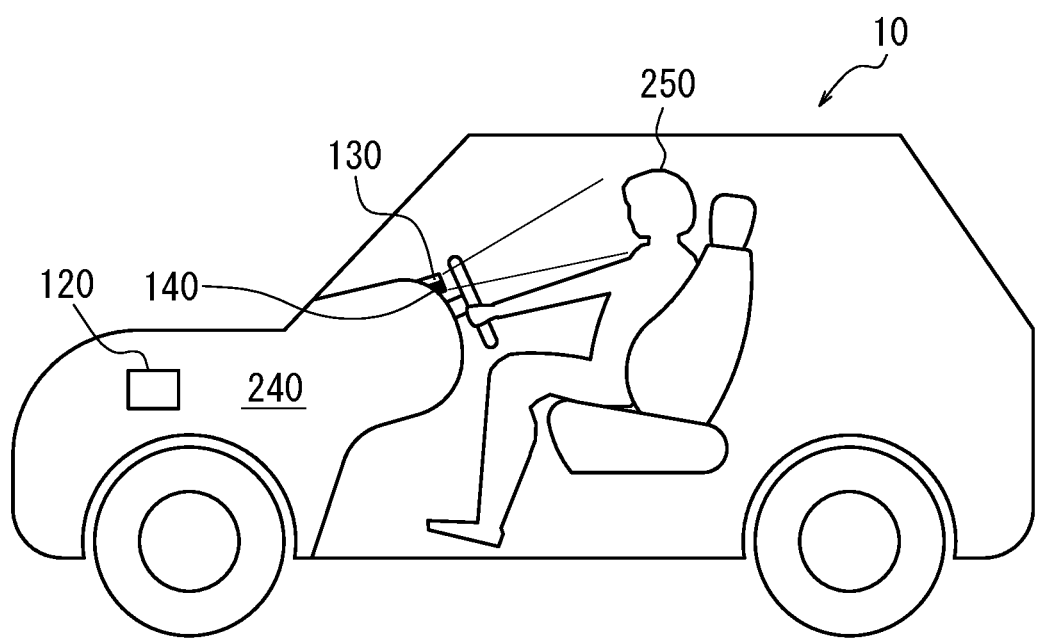
FIG. 8 is a diagram illustrating an arrangement of various units in a car having an imaging apparatus of a second embodiment.

Next, an arrangement of an imaging apparatus 140 according to a second embodiment in the car 10 will be described with reference FIG. 8. In the following description, items identical to those of the first embodiment are denoted by the same reference signs, and descriptions of such items will be omitted.

The car 10 includes a lamp ECU 120, a particular light source 130, and the imaging apparatus 140. The imaging apparatus 140 and the lamp ECU 120 may exchange information and signals one another via the car network such as the dedicated line and the CAN. Also, the lamp ECU 120 and the light source 130 may exchange information and signals one another via the car network such as the dedicated line and the CAN.

The lamp ECU 120 may be disposed in any position in the car 10. The light source 130 may be disposed on, for example, a dashboard 240 of the car 10 to emit light to a face of a subject 250 such as a driver. As described later, the light source 130 emits the light in a particular wavelength range.

The imaging apparatus 140 is arranged on, for example, the dashboard 240 of the car 10 to be able to capture an image of the face of the subject 250 illuminated by the light from the light source 130. In particular, the imaging apparatus 140 is disposed in the car 10 in such a manner that a field of view of the imaging apparatus 140 includes a relatively large region containing the face of the subject 250.

The lamp ECU 120, based on the information obtained from the imaging apparatus 140 as described later, lights up the light source 130. Here, the lamp ECU 120, based on a synchronization signal obtained from the imaging apparatus 140 as described later, lights up the light source 130 in synchronization with timing for capturing an image by the imaging apparatus 140. The lamp ECU 120 leaves the light source 130 turned off when the imaging apparatus 140 operates in a first operation mode as described later, and lights up the light source 130 when the imaging apparatus 140 operates in a second operation mode. The lamp ECU 120, similarly to the first embodiment described above, may transmit the information that the light source 130 is lit up to the imaging apparatus 140.

The light source 130 is, for example, an LED or the like to emit light in a predetermined wavelength range. In the present embodiment, the light source 130 is a lamp to emit light in a wavelength range of 320 nm or less to be absorbed by $O_3$, in a wavelength range of 750 nm to 760 nm to be absorbed by $H_2O$ or $O_2$, in a wavelength range of 930 nm to 970 nm, in a wavelength range of 1100 nm to 1170 nm, and the like. The light source 130 may include, for example, an illumination optical system comprising a lens with adjusted angle of view. The wavelength range and directivity of the light emitted by the light source 130 may be determined as desired. The light source 130 is an infrared light lamp for emitting light of an infrared band such as the wavelength range of 750 nm to 760 nm, the wavelength range of 930 nm to 970 nm, and the wavelength range of 1100 nm to 1170 nm.

The imaging apparatus 140 captures an image of the face of the subject 250 and generates a captured image. The imaging apparatus 140 determines a condition of the subject 250 based on the captured image. The imaging apparatus 140 issues a warning to the subject 250 when determining that the subject 250 is in a particular condition. The following is a description of such a function of the imaging apparatus 140, together with a configuration of the imaging apparatus 140.

Figure 9:
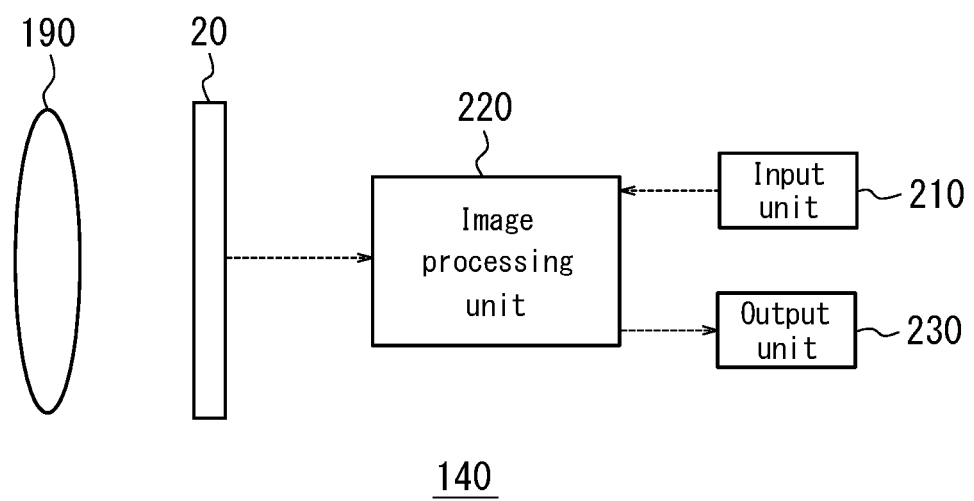
FIG. 9 is a functional block diagram illustrating a schematic configuration of the imaging apparatus of FIG. 8.

As illustrated in FIG. 9, the imaging apparatus 140 includes an optical system 190, the image sensor 20, an input unit 210, an image processing unit 220, and an output unit 230.

The optical system 190 includes an optical element provided with at least one lens in such a manner as to have desired optical properties such as the focal distance, the focal depth, and the angle of view. The optical system 190 forms the subject image in the image sensor 20. The optical system 190 is arranged in a housing of the imaging apparatus 140 in such a manner as to be able to receive reflected light from an object illuminated by the light from the light source 130. In the present embodiment, the optical system 190 is capable of forming the subject image containing the face of the subject 250 illuminated by the light.

Since the image sensor 20 is identical to that of the first embodiment as described above, a description thereof will be omitted.

The input unit 210, when the image processing unit 220 operates in the second operation mode as described later, receives the information that the light source 130 is lit up from the lamp ECU 120.

The image processing unit 220 is, for example, the DSP or the general-purpose CPU for executing the specific function by reading the specific program. The image processing unit 220 performs various image processing on the image signal (hereinafter, also referred to as the "captured image") generated by the image sensor 20 and controls overall operations of the imaging apparatus 140. For example, the image processing unit 220 generates the synchronization signal for indicating the timing for capturing an image and outputs the synchronization signal to the lamp ECU 120 via the output unit 230. Also, the image processing unit 220 controls an operation of the image sensor 20 such that the image sensor 20 captures an image of the subject periodically, e.g., at 60 fps.

In the present embodiment, the image processing unit 220 operates in the first operation mode or the second operation mode as described later.

Operation Mode Determination Process

First, an operation mode determination process for selecting the first operation mode or the second operation mode as the operation mode will be described.

The image processing unit 220 first obtains the captured image (a first captured image) from the image sensor 20. Here, the first captured image is an image captured by pixels having at least color filters thereon which is, for example, a color image.

Subsequently, the image processing unit 220 performs, on the first captured image, first pre-processing such as the exposure adjustment, the white balancing, and the color interpolation. Then, the image processing unit 220 performs, on the first captured image subjected to the first pre-processing, post-processing such as the edge enhancement.

Next, the image processing unit 220 determines whether the brightness of the first captured image subjected to the first pre-processing and the post-processing is lower than a predetermined criteria. Here, the predetermined criteria corresponds to brightness with which detection accuracy of the face of the subject 250 in the first captured image reduces to a certain extent in a subject detection process described later due to, for example, overexposure in the first image. In particular, when the signal strength of the signal components extracted, i.e., a quantity of natural light such as the sunlight entering the car 10 is smaller than a predetermined threshold, the image processing unit 220 determines that the brightness of the first captured image is lower than the criteria. The predetermined threshold may be determined in advance based on experiments, simulations, or the like.

When the signal strength of the signal components extracted is determined as lower than the predetermined threshold, i.e., when the brightness of the first captured image is determined as lower than the predetermined criteria, the image processing unit 220 determines to operate in the first operation mode. Also, the image processing unit 220 outputs a drive stopping request of the light source 130 to the lamp ECU 120 via the output unit 230. When receiving the drive stopping request, the lamp ECU 120 leaves the light source 130 turned off.

On the other hand, when the signal strength of the signal components extracted is determined as equal to or greater than the predetermined threshold, i.e., when the brightness of the first captured image is determined as equal to or higher than the predetermined criteria, the image processing unit 220 determines to operate in the second operation mode.

Also, the image processing unit 220 outputs a drive starting request of the light source 130 to the lamp ECU 120 via the output unit 230. When receiving the drive starting request, the lamp ECU 120 lights up the light source 130 based on the synchronizing signal as described above.

First Operation Mode

Next, an operation of the image processing unit 220 in the first operation mode will be described.

First, the image processing unit 220 obtains the captured image from the image sensor 20. Subsequently, the image processing unit 220 performs the first pre-processing such as the white balancing, the exposure adjustment, and the color interpolation on the captured image. Also, the image processing unit 220 performs, on the captured image subjected to the first pre-processing, post-processing such as the edge enhancement. Here, as the captured image, the first captured image generated in the operation mode determination process described above may be used.

Subsequently, the image processing unit 220 performs the object detection process by using the first captured image, which is the color image. As the object detection process, any method including a method of employing pattern matching and a method of extracting features in the captured image may be employed. Also, the object detection process performed in the first operation mode may use, for example, algorithm corresponding to the color image. Hereinafter, it is assumed that the object detection process detects the face, the eye, and the pupil of the subject 250 (hereinafter, simply referred to as "the face of the subject 250").

Then, the image processing unit 220 issues the warning to the subject 250 based on a result of the detection of the subject 250 in the first captured image. For example, when the eye or the pupil of the subject 250 is not detected in the first captured image for a predetermined time period (i.e., throughout the predetermine number of consecutive frames), it is highly likely that the subject 250 is looking away or falling asleep at the wheel (i.e., in the particular condition). When it is determined that the subject 250 is in the particular condition, the image processing unit 220 issues the warning. The warning may be, for example, generation of an alarm sound through a speaker provided in the imaging apparatus 140, or an output of a warning signal for generating the alarm sound through a speaker provided in the car 10.

Second Operation Mode

Next, an operation of the image processing unit 220 in the second operation mode will be described.

First, the image processing unit 220 obtains the first captured image from the image sensor 20. Subsequently, the image processing unit 220 obtains a second captured image by extracting, from the first captured image obtained from the image sensor 20, pixel signals generated by the pixels having the specific filter thereon. The second captured image is, for example, a monochrome image. Then, the image processing unit 220 performs, on the second captured image, second pre-processing such as the exposure adjustment. Also, the image processing unit 220, on the second image subjected to the second pre-processing, further performs post-processing such as the edge enhancement.

Subsequently, the image processing unit 220 performs the object detection process by using the second captured image, which is the monochrome image. As the object detection process, any method including the method of using the pattern matching or the method of extracting features in the captured image may be used. Also, the object detection process performed in the second operation mode may use, for example, algorithm corresponding to the monochrome image. Hereinafter, it is assumed that the object detection process detects the face, the eye, and the pupil of the subject 250 (hereinafter, simply referred to as "the face of the subject 250").

Then, the image processing unit 220 issues the warning to the subject 250 based on a result of the detection of the subject 250 in the second captured image. For example, when the eye or the pupil of the subject 250 is not detected in the second captured image for a predetermined time period (i.e., throughout the predetermine number of consecutive frames), it is highly likely that the subject 250 is looking away or falling asleep at the wheel (i.e., in the particular condition). When it is determined that the subject 250 is in the particular condition, the image processing unit 220 issues the warning. The warning may be, for example, the generation of the alarm sound through the speaker provided in the imaging apparatus 140 or the output of the warning signal for generating the alarm sound through the speaker provided in the car 10. Here, the algorithm used to determine the condition of the subject 250 in the second operation mode may be different from the algorithm used to determine the condition of the subject 250 in the first operation mode as described above.

Also, the image processing unit 220, while operating in the second operation mode, may perform an abnormality detection process of the light source 130 in a manner similar to abnormality detection process of the first embodiment as described above.

The output unit 230 outputs, to the lamp ECU 120, the drive stopping request or the drive starting request of the light source 130 generated by the image processing unit 220. Also, the output unit 230 outputs the warning signal generated by the image processing unit 220 to, for example, ECU provided in the car 10.

Figure 10:
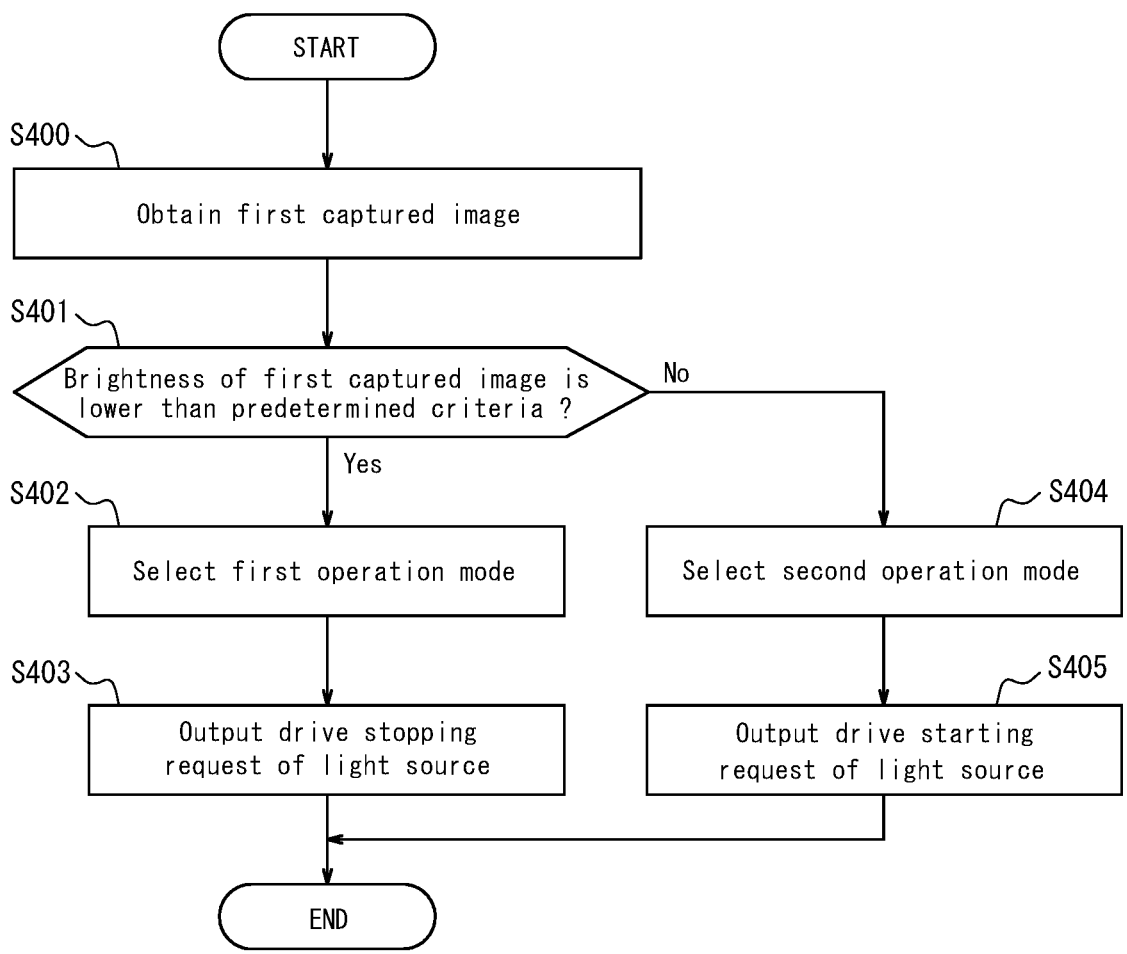
FIG. 10 is a flowchart illustrating an operation mode determination process performed by an image processing unit of FIG. 8.

Next, an operation of the image processing unit 220 to perform the operation mode determination process as described above will be described with reference to FIG. 10. The operation mode determination process may be performed for each frame of the captured image generated by the image sensor 20, or performed intermittently for some frames.

At step S400, the image processing unit 220 obtains the first captured image from the image sensor 20. Also, the image processing unit 220 performs the first pre-processing and the post-processing on the first captured image. Then, the operation mode determination process proceeds to step S401.

At step S401, the image processing unit 220 determines whether the brightness of the first captured image is lower than the predetermined criteria. When the image processing unit 220 determines that the brightness is lower than the predetermined criteria, the operation mode determination process proceeds to step S402. On the other hand, when the image processing unit 220 determines that the brightness is equal to or higher than the predetermined criteria, the operation mode determination process proceeds to step S404.

At step S402, the image processing unit 220 selects the first operation mode as the operation mode. Then, the operation mode determination process proceeds to step S403.

At step S403, the image processing unit 220 outputs the drive stopping request of the light source 130 to the lamp ECU 120 via the output unit 230. Then, the operation mode determination process ends.

At step S404, the image processing unit 220 selects the second operation mode as the operation mode. Then, the operation mode determination process proceeds to step S405.

At step S405, the image processing unit 220 outputs the drive starting request of the light source 130 to the lamp ECU 120 via the output unit 230. Then, the operation mode determination process ends.

Figure 11:
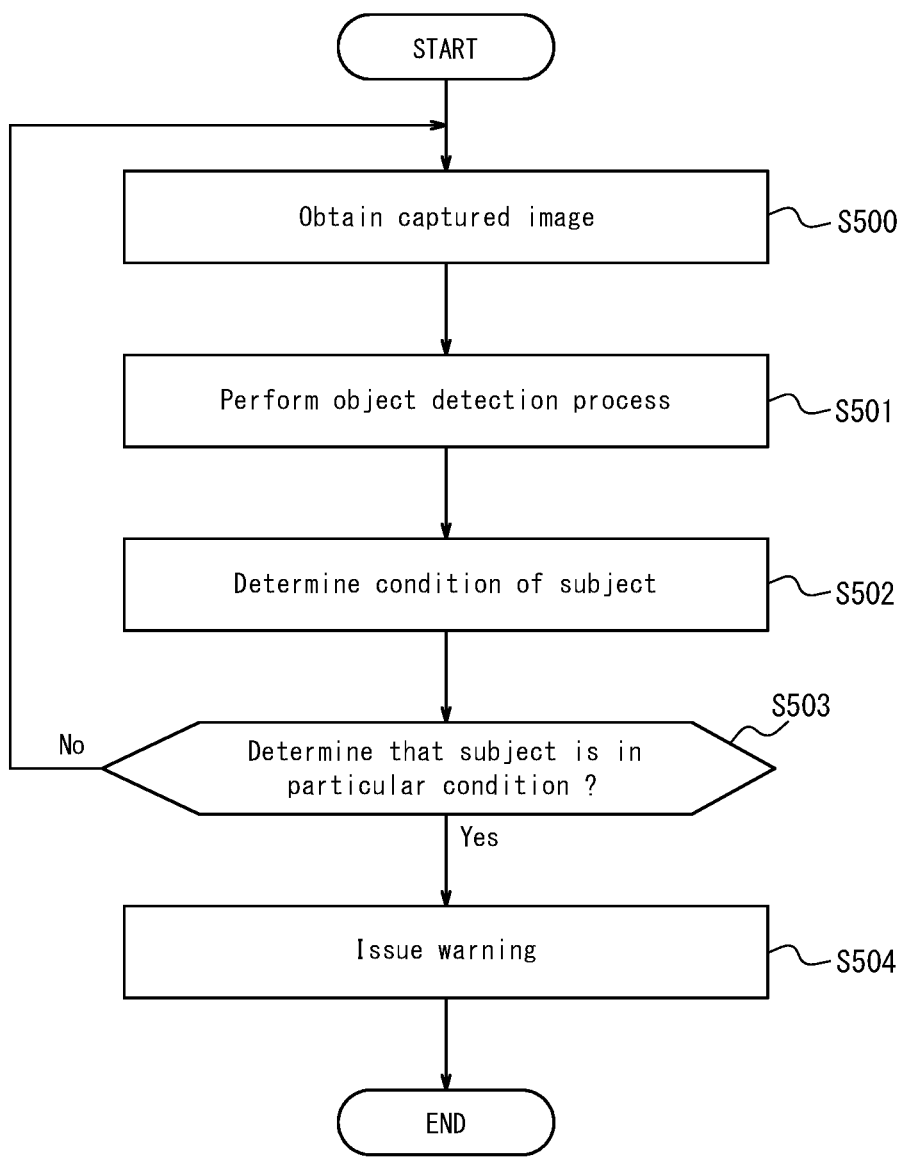
FIG. 11 is a flowchart illustrating an operation of monitoring a condition of a subject performed by the image processing unit of FIG. 8.

Next, respective processes of the image processing unit 220 in the first operation mode and in the second operation mode will be described with reference to FIG. 11.

At step S500, the image processing unit 220 obtains the captured image. In particular, in the first operation mode, the image processing unit 220 obtains the first captured image, which is the color image, and performs the first pre-processing and the post-processing on the first captured image. In the second operation mode, on the other hand, the image processing unit 220 obtains the second captured image, which is the monochrome image, and performs the second pre-processing and the post-processing on the second captured image. Then, the process proceeds to step S501.

At step S501, the image processing unit 220 performs the object detection process by using the captured image. Here, the image processing unit 220 may use different algorithms between the first operation mode and the second operation mode to perform the object detection process. Then, the process proceeds to step S502.

At step S502, the image processing unit 220 determines the condition of the subject 250 based on the result of the detection of the face of the subject 250 by the object detection process. Then, the process proceeds to step S503.

At step S503, when it is determined that the subject 250 is in the particular condition (e.g., the subject 250 is looking away or falling asleep at the wheel), the process proceeds to step S504. On the other hand, when it is determined that the subject 250 is not in the particular condition, the process returns to step S500.

At step S504, the image processing unit 220 issues the warning to the subject 250.

According to the imaging apparatus 140 of the second embodiment configured as described above, when the brightness of the first captured image generated by the pixels having at least the color filter thereon is determined as equal to or higher than the predetermined criteria, the second captured image generated by the pixels having the specific filter alone is obtained. Therefore, when, for example, the first captured image has overexposure due to a large quantity of the natural light such as the sunlight, the second captured image of the light in the particular wavelength range with low spectral irradiance of the sunlight is obtained. Accordingly, accuracy of detection in the object detection process by using, for example, the captured image may be enhanced.

Also, when it is determined that the brightness of the first captured image is lower than the predetermined criteria, i.e., when the imaging apparatus 140 operates in the first operation mode, driving of the light source 130 is stopped. Therefore, since the light source 130 needs to be driven only when the imaging apparatus 140 operates in the second operation mode, power consumption and heat generation of the light source 130 may be reduced.

Although the disclosure has been described based on the figures and the embodiments, it is to be understood that various modifications and changes may be implemented based on the disclosure by those who are ordinarily skilled in the art. Accordingly, such modifications and changes are included in the scope of the disclosure.

For example, although in the first embodiment as described above the imaging apparatus 14 is arranged in such a manner as to be able to capture an image of a view behind the car 10, an imaging direction is not limited thereto. For example, the imaging apparatus 14 may be arranged in such a manner as to be able to capture a subject in front of the car 10. In this case, for example, the particular image processing as described above is performed regardless of whether the particular light source 13 is on or off Therefore, an outline of a subject outside a tunnel which is likely to appear glaring to the naked eyes may be displayed clearly.

The invention claimed is:

1. An imaging apparatus comprising:
    an image sensor having, in a manner corresponding to each pixel on a light receiving surface, at least one type of color filter and a specific filter configured to transmit light in a particular wavelength range in which spectral irradiance of sunlight is lower than that in wavelength ranges adjacent to either side of the particular wavelength range; and
    an image processor configured to determine whether brightness of a first captured image generated by at least a pixel of the image sensor having the color filter thereon meets a predetermined criteria, and obtain, when determining that the brightness of the first captured image is equal to or higher than the predetermined criteria, a second captured image generated by pixels having the specific filters alone,
    wherein the image processor, when the brightness of the first captured image is determined as lower than the predetermined criteria, stops driving a particular light source configured to emit light in the particular wavelength range, and
    when the brightness of the first captured image is determined as equal to or higher than the predetermined criteria, starts driving the light source.

2. The imaging apparatus according to claim 1, wherein the image processor,
    when the brightness of the first captured image is determined as lower than the predetermined criteria, performs an object detection process using the first captured image, and
    when the brightness of the first captured image is determined as equal to or higher than the predetermined criteria, performs the object detection process using the second captured image.

3. The imaging apparatus according to claim 2, wherein the image processor issues a warning to a subject when it is determined that, based on a result of the object detection process, the subject inside a vehicle is in a particular condition.

4. The imaging apparatus according to claim 1, wherein the particular wavelength range is a wavelength range to be absorbed by at least one of $H_2O$ and $O_2$.

5. The imaging apparatus according to claim 1, wherein the at least one type of color filter is an R filter, a G filter, and a B filter, and
    a unit array consisting of one each of the R filter, the G filter, the B filter, and the specific filter is cyclically two-dimensionally located.

* * * * *